(12) United States Patent
Irsigler et al.

(10) Patent No.: US 9,525,043 B2
(45) Date of Patent: Dec. 20, 2016

(54) SEMICONDUCTOR DEVICE AND METHOD OF MANUFACTURING A SEMICONDUCTOR DEVICE

(71) Applicant: Infineon Technologies Austria AG, Villach (AT)

(72) Inventors: Peter Irsigler, Obernberg/Inn (AT); Hans-Joachim Schulze, Taufkirchen (DE)

(73) Assignee: Infineon Technologies Austria AG, Villach (AT)

( * ) Notice: Subject to any disclaimer, the term of this patent is extended or adjusted under 35 U.S.C. 154(b) by 0 days.

(21) Appl. No.: 14/612,344

(22) Filed: Feb. 3, 2015

(65) Prior Publication Data

US 2015/0147856 A1 May 28, 2015

Related U.S. Application Data

(63) Continuation of application No. 13/488,524, filed on Jun. 5, 2012, now abandoned.

(51) Int. Cl.
| | |
|---|---|
| *H01L 29/66* | (2006.01) |
| *H01L 21/223* | (2006.01) |
| *H01L 29/06* | (2006.01) |
| *H01L 29/78* | (2006.01) |
| *H01L 29/08* | (2006.01) |
| *H01L 29/10* | (2006.01) |

(52) U.S. Cl.
CPC ..... *H01L 29/66712* (2013.01); *H01L 21/2236* (2013.01); *H01L 29/0634* (2013.01); *H01L 29/7802* (2013.01); *H01L 29/0649* (2013.01); *H01L 29/0878* (2013.01); *H01L 29/1095* (2013.01)

(58) Field of Classification Search
CPC ............ H01L 29/0634; H01L 29/1095; H01L 29/0878; H01L 2924/0002; H01L 29/41766
See application file for complete search history.

(56) References Cited

U.S. PATENT DOCUMENTS

| | | |
|---|---|---|
| 2009/0315137 A1 | 12/2009 | Kwon et al. |
| 2011/0097864 A1 | 4/2011 | Lee et al. |
| 2011/0284955 A1 | 11/2011 | Sapp et al. |
| 2013/0072007 A1 | 3/2013 | Xia et al. |
| 2013/0140708 A1 | 6/2013 | Lin et al. |

FOREIGN PATENT DOCUMENTS

| | | |
|---|---|---|
| CN | 101241933 A | 8/2008 |
| CN | 101471264 A | 7/2009 |
| CN | 102148163 A | 8/2011 |
| CN | 102157384 A | 8/2011 |
| DE | 10240107 B4 | 3/2008 |
| JP | 2007235080 A | 9/2007 |

OTHER PUBLICATIONS

Miller et al. [Plasma Doping—Enabling Technology for High Dose Login and Memory Application.*
Miller, et al., "Plasma Doping—Enabling Technology for High Dose Logic and Memory Applications", Ion Implantation Technology, CP1066. 2008. pp. 457-460. American Institute of Physics, USA.

* cited by examiner

*Primary Examiner* — Tony Tran
(74) *Attorney, Agent, or Firm* — Murphy, Bilak & Homiller, PLLC

(57) ABSTRACT

A method of manufacturing a semiconductor device includes forming a trench in a semiconductor body. The method further includes doping a part of the semiconductor body via sidewalls of the trench by plasma doping.

16 Claims, 12 Drawing Sheets

SEMICONDUCTOR DEVICE AND METHOD OF MANUFACTURING A SEMICONDUCTOR DEVICE

BACKGROUND

A key component in semiconductor applications is a solid state switch. As an example, switches turn loads of automotive applications or industrial applications on and off. Solid state switches typically include, for example, field effect transistors (FETs) like metal-oxide-semiconductor FETs (MOSFETs) or insulated gate bipolar transistors (IGBTs).

Key demands on solid state switches are low on-state resistance (Ron) and high breakdown voltage (Vbr). Minimizing the on-state resistance is often at the expense of the breakdown voltage. Therefore, a trade-off between Ron and Vbr has to be met.

Superjunction structures are widely used to improve a trade-off between the on-state resistance and the breakdown voltage. In a conventional n-channel superjunction device, alternating n-doped and p-doped regions replace one comparatively lower n-doped drift zone. In an on-state, current flows through the n-doped regions of the superjunction device which lowers the Ron. In an off or blocking state, the p-doped regions and the n-doped regions deplete or compensate each other to provide a high Vbr. A compensation structure design is one key element for improving the trade-off between Ron and Vbr.

Accordingly, a method of manufacturing a superjunction device and a superjunction device with an improved compensation structure design is needed.

SUMMARY

According to an embodiment of a method of manufacturing a semiconductor device, the method includes forming a trench in a semiconductor body. The method further includes doping a part of the semiconductor body via sidewalls of the trench by plasma doping.

According to an embodiment of a semiconductor device, the semiconductor device includes a first semiconductor region of a first conductivity type at a sidewall of a trench extending into a semiconductor body from a first side. The semiconductor body further includes a drift zone of the first conductivity type. The semiconductor device further includes a first semiconductor layer over the first semiconductor region in the trench. The first semiconductor layer is of a second conductivity type complementary to the first conductivity type. The first conductivity type of the first semiconductor region is determined by a first species of dopants in the first semiconductor region. A doping profile of the first species of dopants declines from a maximum in the first semiconductor region to a minimum or to a minimum doping plateau in the drift zone. A value of the doping at the maximum is at least a factor of 10 higher than the doping at the minimum or at the minimum doping plateau.

Those skilled in the art will recognize additional features and advantages upon reading the following detailed description and upon viewing the accompanying drawings.

BRIEF DESCRIPTION OF THE DRAWINGS

The accompanying drawings are included to provide a further understanding of the present invention and are incorporated in and constitute a part of the specification. The drawings illustrate embodiments of the present invention and together with the description serve to explain principles of the invention. Other embodiments of the invention and many of the intended advantages will be readily appreciated as they become better understood by reference to the following detailed description. The elements of the drawings are not necessarily to scale relative to each other. Like reference numerals designate corresponding similar parts.

DETAILED DESCRIPTION

Figure 1:
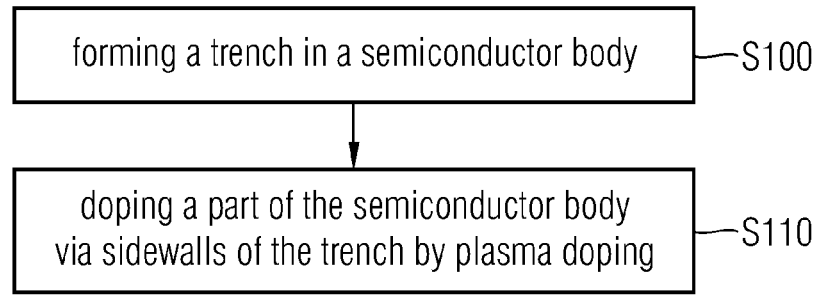
FIG. 1 is a schematic process chart of one embodiment of a method of manufacturing a semiconductor device according to an embodiment.

In the following detailed description, reference is made to the accompanying drawings, which form a part hereof, and in which is shown by way of illustration specific embodiments in which the invention may be practiced. In this regard, directional terminology, such as "top", "bottom", "front", "back", "leading", "trailing", "over", "above", "below", etc., is used with reference to the orientation of the Figure(s) being described. Because components of the embodiments can be positioned in a number of different orientations, the directional terminology is used for purposes of illustration and is in no way limiting. It is to be understood that other embodiments may be utilized and structural or logical changes may be made without departing from the scope of the present invention. For example, features illustrated or described as part of one embodiment can be used on or in conjunction with other embodiments to yield yet a further embodiment. It is intended that the present invention includes such modifications and variations. The examples are described using specific language which should not be construed as limiting the scope of the appending claims. The drawings are not scaled and are for illustrative purposes only. For clarity, the same elements or manufacturing processes have been designated by the same references in the different drawings if not stated otherwise.

The terms "lateral" and "horizontal" as used in this specification intends to describe an orientation parallel to a first surface of a semiconductor substrate or semiconductor body. This can be for instance the surface of a wafer or a die.

The term "vertical" as used in this specification intends to describe an orientation which is arranged perpendicular to the first surface of the semiconductor substrate or semiconductor body.

As employed in this specification, the terms "coupled" and/or "electrically coupled" are not meant to mean that the elements must be directly coupled together—intervening elements may be provided between the "coupled" or "electrically coupled" elements. The term "electrically connected" intends to describe a low-ohmic electric connection between the elements electrically connected together.

In this specification, n-doped may refer to a first conductivity type while p-doped is referred to a second conductivity type. It goes without saying that the semiconductor devices can be formed with opposite doping relations so that the first conductivity type can be p-doped and the second conductivity type can be n-doped. Furthermore, some Figures illustrate relative doping concentrations by indicating "−" or "+" next to the doping type. For example, "n⁻" means a doping concentration which is less than the doping concentration of an "n"-doping region while an "n⁺"-doping region has a larger doping concentration than the "n"-doping region. Indicating the relative doping concentration does not, however, mean that doping regions of the same relative doping concentration have the same absolute doping concentration unless otherwise stated. For example, two different n⁺ regions can have different absolute doping concentrations. The same applies, for example, to an n⁺ and a p⁺ region.

Specific embodiments described in this specification pertain to, without being limited thereto, power semiconductor devices which are controlled by field-effect and particularly to unipolar devices such as MOSFETs.

The term "field-effect" as used in this specification intends to describe the electric field mediated formation of an "inversion channel" and/or control of conductivity and/or shape of the inversion channel in a semiconductor channel region.

In the context of the present specification, the term "MOS" (metal-oxide-semiconductor) should be understood as including the more general term "MIS" (metal-insulator-semiconductor). For example, the term MOSFET (metal-oxide-semiconductor field-effect transistor) should be understood to include FETs having a gate insulator that is not an oxide, i.e., the term MOSFET is used in the more general term meaning IGFET (insulated-gate field-effect transistor) and MISFET, respectively.

FIG. 1 illustrates a schematic process chart of a method of manufacturing a semiconductor device. The method includes forming a trench in a semiconductor body (S100) and doping a part of the semiconductor body via sidewalls of the trench by plasma doping (S110).

The semiconductor body may be a pre-processed single-crystalline semiconductor substrate, for example a single-crystalline silicon substrate (Si substrate), a SiC substrate, a GaN substrate, a GaAs substrate or a silicon-on-insulator substrate. The semiconductor body may include none, one or a plurality of doped and/or undoped layers on the single-crystalline semiconductor substrate, e.g. epitaxial semiconductor layers. As an example, a thickness of the semiconductor layer(s) formed on the single-crystalline semiconductor substrate as well as a doping of the one or several layers may be appropriately chosen with regard to a desired voltage blocking capability of the semiconductor device that is to be formed in the semiconductor body. In particular the doping level of the semiconductor body should be chosen in such a way that the charge balance of the final compensation device is adequate for a desired blocking behavior.

The trench may be formed by an appropriate process, e.g. dry and/or wet etching. As an example, the trench may be formed in a silicon body by an anisotropic plasma etch process, e.g. reactive ion etching (RIE) using an appropriate etch gas, e.g. at least one of $Cl_2$, $Br_2$, $CCl_4$, $CHCl_3$, $CHBr_3$, $BCl_3$, HBr. According to an embodiment, sidewalls of the trench may be slightly tapered, e.g. including a taper angle between 88° and 90°. Slightly tapered trench sidewalls may be beneficial with regard to avoiding trench cavities when filling up trenches.

Plasma doping of the part of the semiconductor body via sidewalls of the trench allows high dose implants at low energies and is also known as PLAD (plasma doping) or PIII (plasma immersion ion implantation). These methods allow for a precise doping of the part of the semiconductor body at the trench sidewalls. A conformal doping of the part of the semiconductor body at the trench sidewalls can be achieved by applying a voltage to a substrate surrounded by a radio frequency (RF) plasma including a dopant gas. Collisions between ions and neutral atoms as well as the biasing of the substrate lead to a broad annular distribution of the dopants allowing for a homogeneous doping over the trench sidewalls. Also a small vertical gradient in dose of doping in the part of the semiconductor body may be achieved by plasma doping. This allows for a vertical variation of a degree of charge compensation improving stability of manufacture and/or avalanche robustness. A vertical variation of dose of doping may be smaller 20%, or smaller than 10% or smaller than 5%.

When doping with PLAD, the semiconductor substrate, e.g. a semiconductor wafer, is exposed to a plasma including ions of dopants. These ions are accelerated by an electric field towards the substrate and are implanted into an exposed surface of the substrate. An implanted dose can be adjusted or controlled via DC voltage pulses, e.g. negative voltage pulses. A Faraday system allows to adjust or control the dose. Two sets of coils, i.e. a horizontal coil and a vertical coil allow to generate the plasma and keep it homogeneous. An ion density can be adjusted via a distance between the coils and the substrate. Interaction between the vertical coils and the horizontal coils allows to adjust or control homogeneity and the ion density.

A penetration depth of the dopants into the semiconductor body and the implant dose may be adjusted via a pulsed DC voltage applied between the semiconductor substrate and a shield ring surrounding it.

According to an embodiment, doping the part of the semiconductor body by plasma doping includes introducing the dopants into the part of the semiconductor body via the sidewalls at a dose in a range of $5 \times 10^{11}$ cm$^{-2}$ to $5 \times 10^{12}$ cm$^{-2}$, or in a range of $7 \times 10^{11}$ cm$^{-2}$ to $2 \times 10^{12}$ cm$^{-2}$. This comparatively low dose requires modifications of the pulsed DC voltage typically used. Typically doses exceeding $10^{15}$ cm$^{-2}$ are implanted by these techniques. According to an embodiment, a pulse distance of the DC voltage pulses is adjusted in a range of 100 µs to 10 ms, in particular between 500 µs and 5 ms. A DC voltage pulse rise time is set to a value smaller than 0.1 µs, for example. According to an embodiment a pulse width ranges between 0.5 µs to 20 µs, or between 1 µs to 10 µs.

According to an embodiment, the semiconductor body includes a drift zone of a first conductivity type. Doping the part of the semiconductor body by plasma doping includes doping the part of the semiconductor body with dopants of a second conductivity type complementary to the first conductivity type. According to one embodiment, the doped part of the semiconductor body constitutes a charge compensation region, e.g. a p-doped column between an n-doped drift zone of a superjunction semiconductor device. According to another embodiment, a transistor or diode device is formed as the semiconductor device and includes the doped part of the semiconductor body as a vertical edge termination structure. According to an embodiment, the semiconductor device is a power semiconductor device including a breakdown voltage or voltage blocking capability of at least 100 V or at least 300 V.

According to an embodiment, further to plasma doping of the part of the semiconductor at the sidewalls, a variation of doping along the vertical direction in a silicon semiconductor body may be achieved by high energy implantation of protons for n-doping or helium for p-doping. This allows to improve an avalanche ruggedness of the device.

Further process steps for manufacturing semiconductor zones, e.g. source, drain, body, highly doped contact zones, and gate structures, trench fillings, dielectric layers, interlevel dielectrics, conductive layers such as highly doped semiconductor layer(s) or metal layer(s) may follow to complete the semiconductor device.

FIGS. 2A to 2F illustrate schematic cross-sectional views of an n⁻-doped semiconductor body 210 at different phases of processing a semiconductor device. A mask 212 is formed on a first side 214 of the semiconductor body 210. Patterning of the mask 212, e.g. by lithography, results in mask openings. A trench 216 is formed from the first side 214 into the semiconductor body 210, e.g. by using an anisotropic etch process such as RIE.

As an example, a width w of the trench 216 may range between 0.1 µm to 15 µm or between 1 µm to 10 µm. A depth d of the trench 216 may range between 10 µm to 120 µm or between 20 µm to 60 µm. As an example, the depth d may be appropriately chosen with regard to a desired voltage blocking capability of the semiconductor device to be manufactured.

Figure 2A:
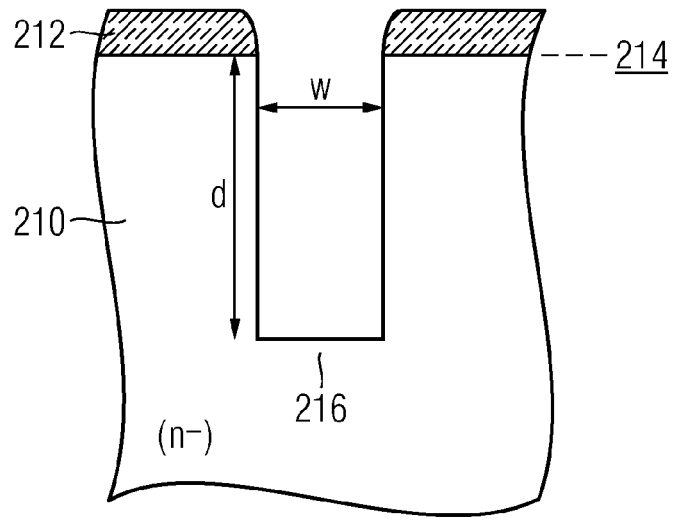
FIGS. 2A to 2F are cross-sectional views of a semiconductor body at different process phases during one embodiment of a method of manufacturing a superjunction device.
Figure 2B:
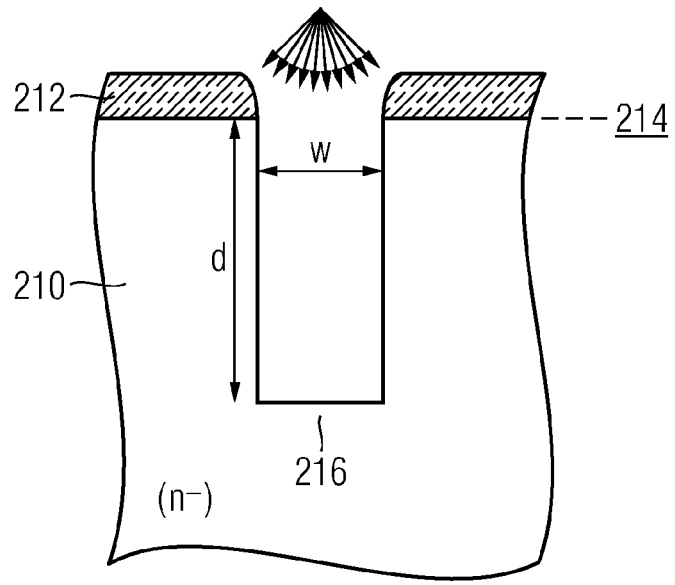
Figure 2C:
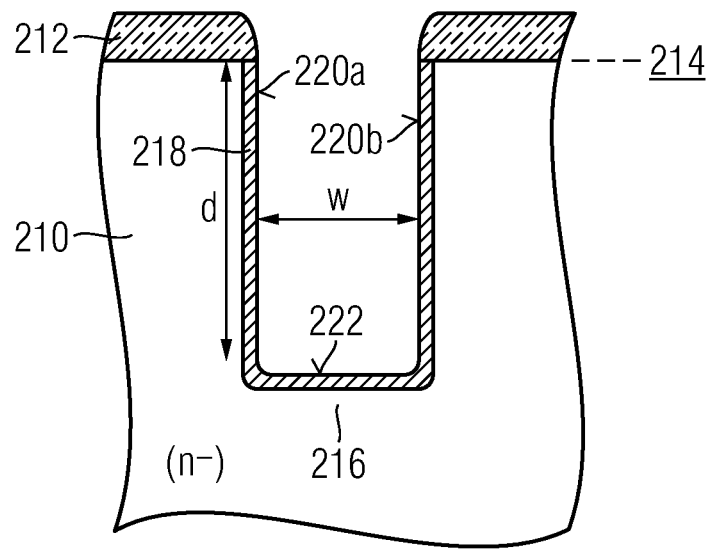

Referring to the schematic cross-sectional view of the semiconductor body 210 illustrated in FIG. 2B, plasma doping by PLAD or PIII using a process gas configured for p-doping, e.g. $BF_3$ and/or $B_2H_6$ is carried out. Plasma doping leads to p-doping of a part 218 of the semiconductor body 210 at sidewalls 220a, 220b as well as at a bottom side 222 of the trench 216 (FIG. 2C). A penetration depth of the dopants, or, in other words, a thickness of the part 218 after PLAD is comparatively low, e.g. in a range between 0.2 nm and 20 nm, or between 0.5 nm to 10 nm or even between 1 nm to 3 nm since comparatively low voltages in the range of 100 V to 12 kV are used in PLAD to accelerate ions towards the semiconductor substrate. As regards further parameter of plasma doping, reference is drawn to FIG. 1 and the related part of the description.

Figure 2D:
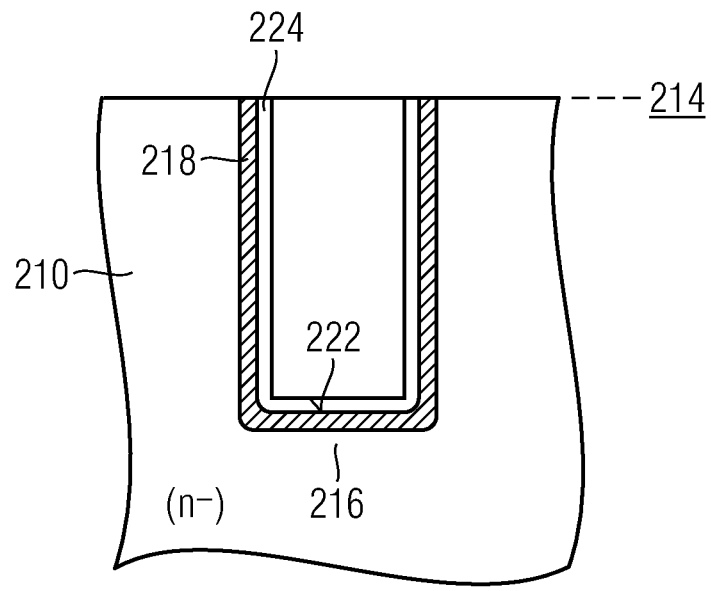

Referring to the schematic cross-sectional view of the semiconductor body 210 illustrated in FIG. 2D, the mask 212 is removed from the first side 214, e.g. by an etch process. Further, an optional outdiffusion barrier layer 224 is formed on the sidewalls 220a, 220b and on the bottom side 222 of the trench 216. The optional outdiffusion barrier layer 224 lines the p-doped part 218 of the semiconductor body 210. The outdiffusion barrier layer 224 counteracts or avoids outdiffusion of the p-type dopants introduced into the part 218 by plasma doping. This allows to keep the implanted dose within the semiconductor body 210. In other words, the outdiffusion barrier layer 224 allows to improve an accuracy of charge compensation in a superjunction device. As an example, the outdiffusion barrier layer 224 may be formed as a silicon layer by CVD at low temperatures, e.g. at temperatures in the range of 300° C. and 700° C. or in a range of 400° C. to 600° C. According to another embodiment, the outdiffusion barrier layer 224 may be formed by deposition of an amorphous silicon layer followed by crystallizing the amorphous silicon layer at temperatures ranging typically between 400° C. and 600° C. As an alternative or in addition, the outdiffusion barrier layer 224 may consist of or include an insulating layer, e.g. an oxide layer formed by CVD or plasma enhanced CVD (PECVD). In the embodiment illustrated in FIGS. 2A to 2F, the part 218 covers the bottom side 222 of the trench 216. According to another embodiment, the part 218 may be removed from the bottom side 222 of the trench 216, e.g. by an etch process. According to yet another embodiment, the part 218 covering the bottom side 222 of the trench 216 may be counter doped leading to an n-doping at the bottom side 222. Diffusion of the p-type dopants introduced by plasma doping is carried out by thermal heating to widen a profile after PLAD or PIII which is comparatively small due to the low penetration depth of the dopants achieved by these methods.

The outdiffusion barrier layer 224 and/or an optional insulating layer as part of the outdiffusion barrier layer 224 may be removed after diffusion, e.g. by an etch process. But in case of the deposition of silicon this is typically not necessary.

Figure 2E:
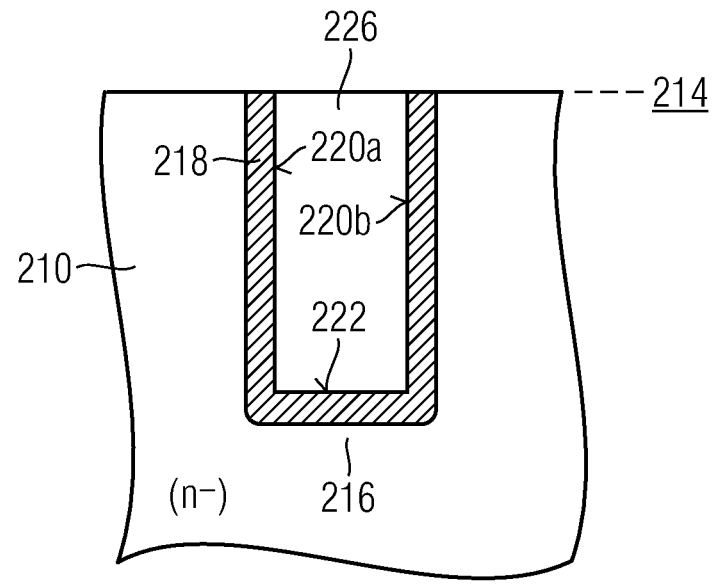

Referring to the schematic cross-sectional view of the semiconductor body 210 illustrated in FIG. 2E, the trench 216 is at least partly filled up with an insulating material, e.g. an oxide or nitride, and/or a semiconductor material, e.g. an epitaxial silicon layer formed by lateral epitaxial processes or by CVD. Thus, a filling material 226 fills up the trench 216. In case of filling up the trench 216 with semiconductor material, the semiconductor material may be undoped or may typically include a doping concentration below the doping concentration introduced by the above-described plasma doping of the p-doped part 218 or may include a doping concentration which is similar to the doping of the semiconductor body 210 so that it can contribute to a current flow with low resistance.

According to an embodiment, thermal heating is carried out to further widen a lateral doping profile of the p-doped part 218.

Figure 2F:
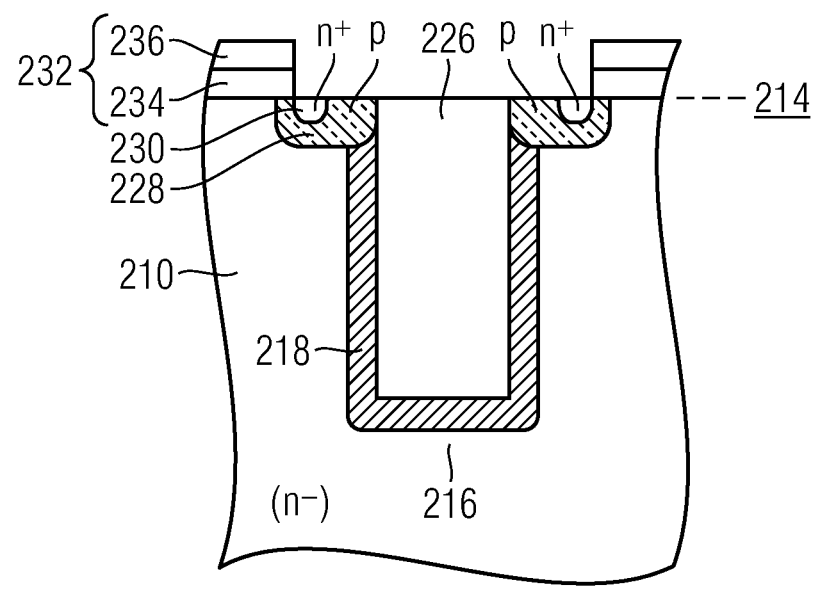

Referring to the schematic cross-sectional view of the semiconductor body 210 illustrated in FIG. 2F, further processes for manufacturing a superjunction semiconductor device are illustrated. A p-doped body region 228 is formed at the first side 214, e.g. by ion implantation of p-type dopants such as boron (B). Further, an n⁺-doped source zone 230 is formed in the p-doped body region 228 at the first side 214, e.g. by ion implantation of n-type dopants such as phosphor (P). Further, a planar gate structure 232 including a gate dielectric 234 and a gate electrode 236 is formed at the first side 214. Additional known elements such as a drain at a second side opposite to the first side 214, dielectric layers such as interlayer dielectrics and conductive layers such as metallization layers which may be interconnected or connected to the semiconductor body by contacts may follow to complete the superjunction device. In the exemplary device illustrated in FIG. 2F, the part 218 constitutes a charge compensation region of a superjunction device. According to other embodiments, the trench 216 and the part 218 may constitute a vertical edge termination structure in an edge area termination area surrounding an active cell area of a transistor device, e.g. an IGBT or MOSFET.

FIGS. 3A to 3F illustrate schematic cross-sectional views of an n⁻-doped semiconductor body 310 at different phases of processing a superjunction semiconductor device. A mask 312 is formed on a first side 314 of the semiconductor body 310. Patterning of the mask 312, e.g. by lithography, results in mask openings. Trenches 316 are formed from the first side 314 into the semiconductor body 310, e.g. by using an anisotropic etch process such as RIE.

Figure 3A:
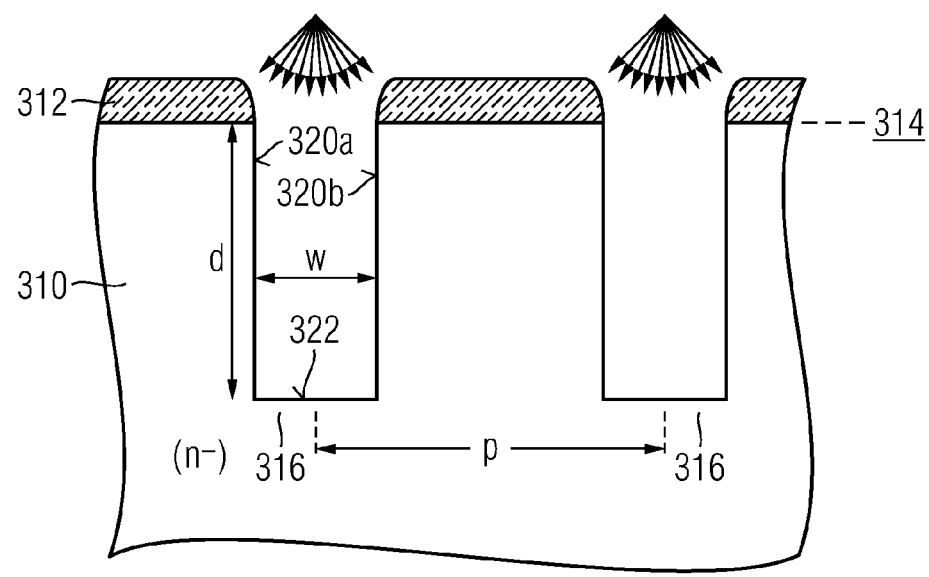
FIGS. 3A to 3F illustrate schematic cross-sectional views of a semiconductor body at different process phases during another embodiment of a method of manufacturing a superjunction device.
Figure 3B:
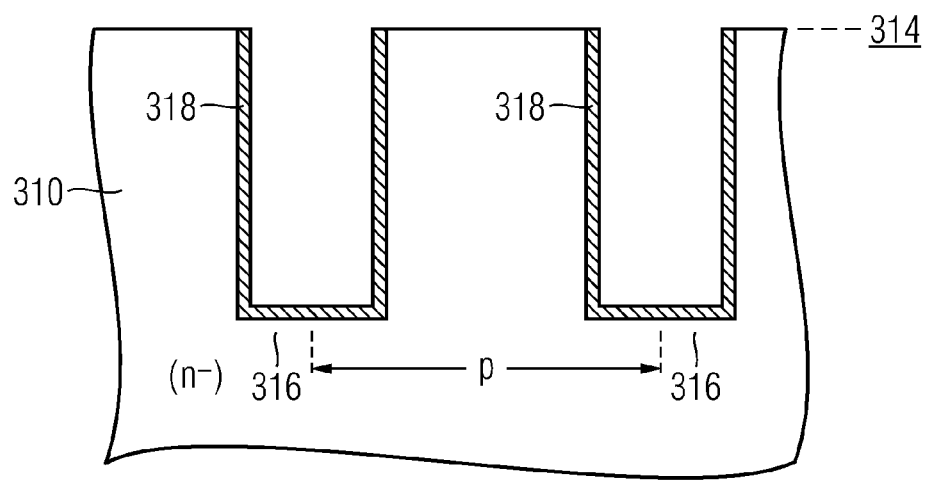

Dimensions of the trenches 316, e.g. a width w and a depth d, may be chosen as described with regard to the embodiment illustrated in FIGS. 2A to 2F. A pitch p between a middle of neighboring trenches 316 may range between 0.2 µm and 50 µm or between 0.5 µm to 30 µm or even between 1 µm to 5 µm. Plasma doping by PLAD or PIII using a process gas configured for n-doping, e.g. $PF_3$ and/or $PH_3$ is carried out. Plasma doping leads to n-doping of a part 318 of the semiconductor body 310 at sidewalls 320a, 320b as well as at a bottom side 322 of the trenches 316 (FIG. 3B). A penetration depth of the dopants, or, in other words, a thickness of the part 318 after PLAD is comparatively low, e.g. in a range between 0.2 nm and 20 nm, or between 0.5 nm to 10 nm or even between 1 nm to 3 nm since comparatively low voltages in the range of 100 V to 12 kV are used in PLAD to accelerate ions towards the semiconductor substrate. As regards further parameter of plasma doping, reference is drawn to FIG. 1 and the related part of the description. According to an embodiment, a dose of dopants introduced by plasma doping via a unit area of the sidewalls 320a, 320b is at least five times larger or even ten or twenty times larger than a dose of dopants in a part of the semiconductor body 310 between the trenches 316 which corresponds to $(p-w)/2 \times N$, wherein N is a net doping of the n⁻-doped semiconductor body 310 between the trenches 316. Further, the mask 312 is removed from the first side 314, e.g. by an etch process.

Figure 3C:
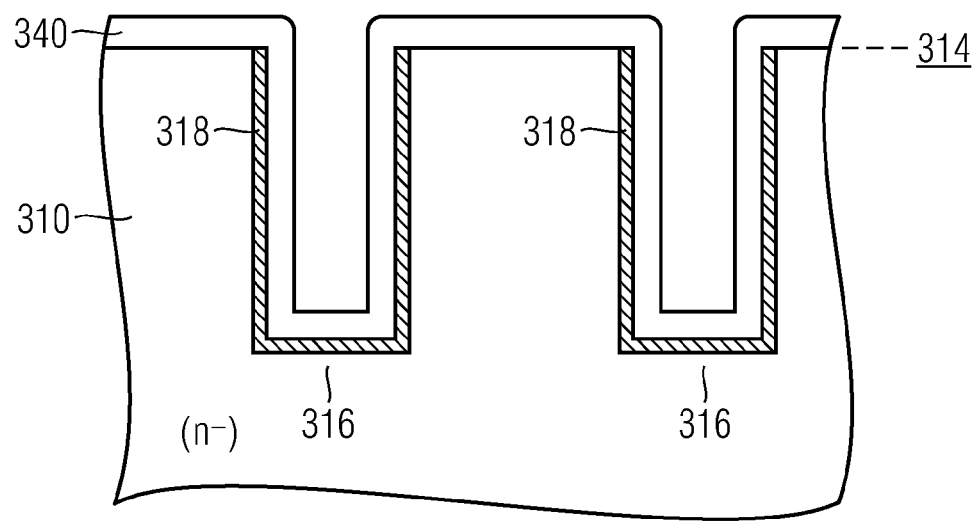

Referring to the schematic cross-sectional view of the semiconductor body 310 illustrated in FIG. 3C, a first semiconductor layer 340, e.g. a conformal undoped or lightly doped silicon layer is formed on the part 318 in the trenches 316 by lateral epitaxy or CVD. As an example, a lateral epitaxial process or low pressure CVD (LPCVD) may be used to achieve a conformal deposition of the first semiconductor layer 340 lining the sidewalls 320a, 320b and the bottom side 322 of the trenches 316. As an example, a thickness of the first semiconductor layer 340 may range between 5% and 30% or between 10% and 20% of the width w.

Figure 3D:
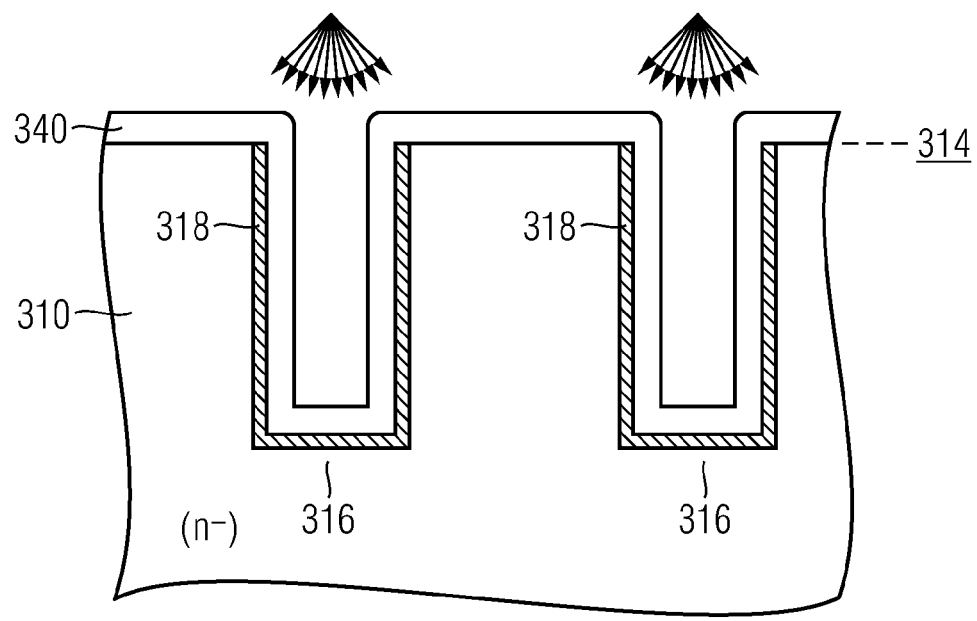
Figure 3E:
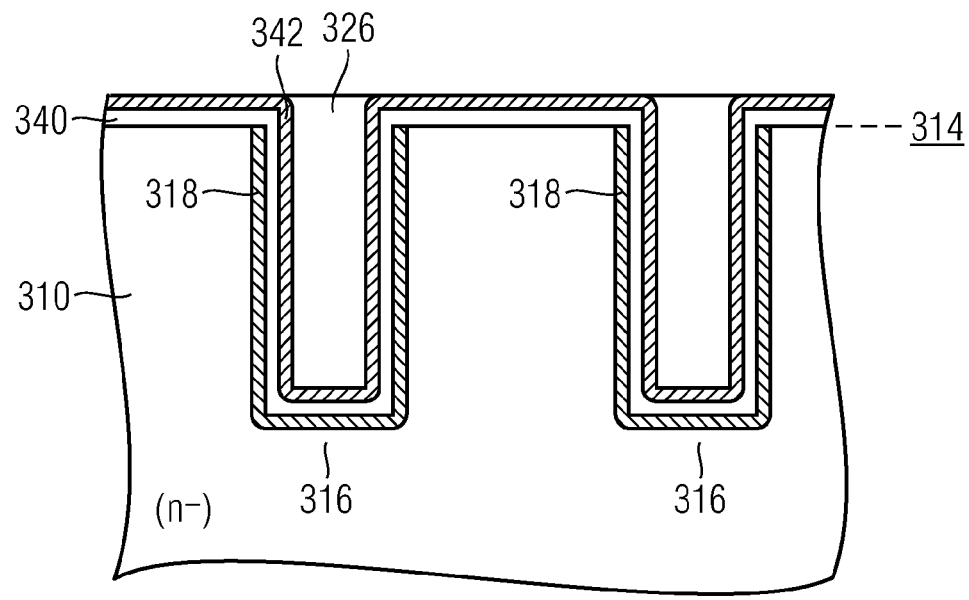

Referring to the schematic cross-sectional view of the semiconductor body 310 illustrated in FIG. 3D, plasma doping by PLAD or PIII using a process gas configured for p-doping, e.g. $BF_3$ and/or $B_2H_6$ is carried out. Plasma doping leads to p-doping of the first semiconductor layer 340. A penetration depth of the dopants, or, in other words, a thickness of a doped part 342 of the first semiconductor layer 340 after PLAD is comparatively low, e.g. in a range between 0.2 nm and 20 nm, or between 0.5 nm to 10 nm or even between 1 nm to 3 nm (FIG. 3E). As regards further parameter of plasma doping, reference is drawn to FIG. 1 and the related part of the description. According to an embodiment, a dose of dopants introduced by plasma doping via a unit area of the sidewalls 320a, 320b deviates by less 10%, or less than 5% or even less than 3% from the dose of dopants previously introduced into the part 318 by plasma doping.

Further referring to the schematic cross-sectional view of the semiconductor body 310 illustrated in FIG. 3E, the trenches 316 are filled up with an insulating material, e.g. an oxide or nitride, and/or a semiconductor material, e.g. an epitaxial silicon layer formed by lateral epitaxy or CVD. Thus, a filling material 326 fills up the trenches 316. In case of filling up the trenches 316 with semiconductor material, the semiconductor material may be undoped or may include a doping concentration below the doping concentration introduced by the above-described plasma doping of the n-doped part 318 or p-doped first semiconductor layer 340.

Between plasma doping of the first semiconductor layer 340 and filling up the trenches 316, an outdiffusion barrier layer as illustrated in FIG. 2D may be formed on the first semiconductor layer 340 followed by thermal heating for widening lateral profiles of p-doping and n-doping in the parts 318, 342, respectively. Optionally a mask against outdiffusion can also be deposited directly after the first plasma doping process with a subsequent high-temperature step and an optional removal of this mask.

Figure 3F:
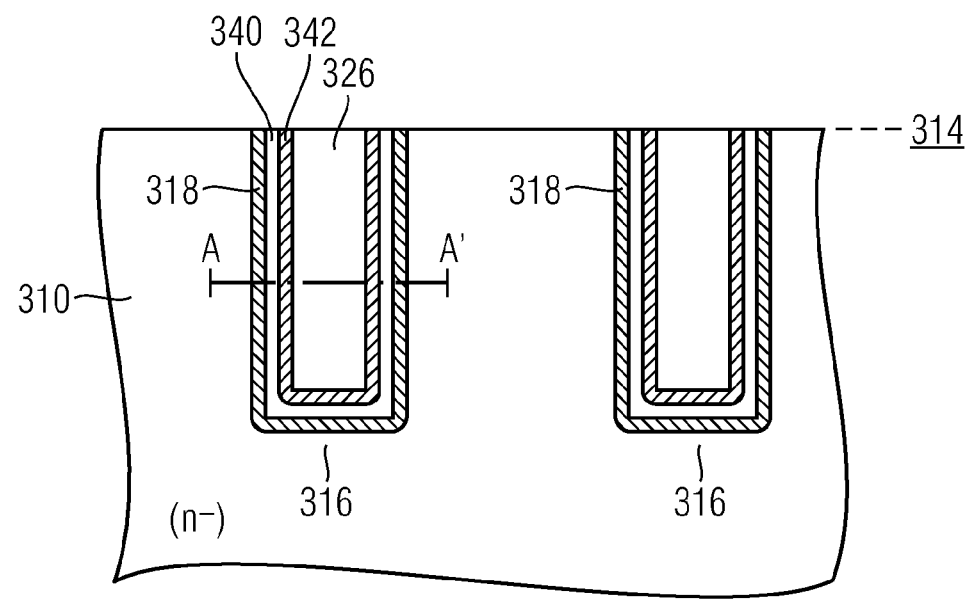

Referring to the schematic cross-sectional view of the semiconductor body 310 illustrated in FIG. 3F, the semiconductor body 310 is planarized at the first side 340, e.g. by chemical mechanical polishing (CMP) and/or by a plasma etch back. Thereby, the first semiconductor layer 340 is removed from the first side 314.

Further processes for manufacturing a superjunction semiconductor device follow. For further details in this regard, reference is drawn to FIG. 2F and the related part of the specification.

Figure 3G:
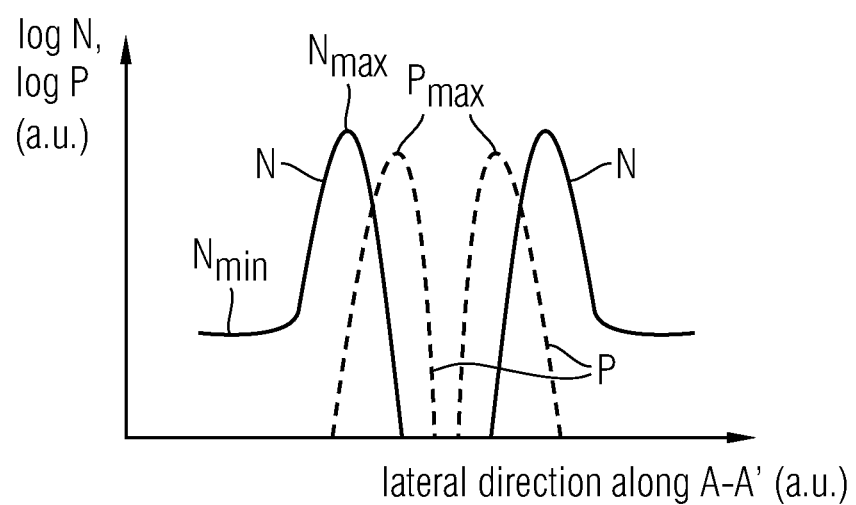
FIG. 3G is a schematic illustration of profiles of p-doping and n-doping along a line A-A' of FIG. 3F.

FIG. 3G is a schematic illustration of profiles of p-doping and n-doping along a line A-A' of FIG. 3F.

A lateral width of the profiles depends upon a thermal budget leading to a widening of the profiles by diffusion. A doping profile N of a species of n-dopants declines from a maximum Nmax in the part 318 to a minimum doping plateau Nmin in a drift zone being part of the semiconductor body 310 between the trenches 316. A value of the doping at the maximum Nmax is at least a factor of ten or a factor of twenty larger than the doping at the minimum plateau Nmin. Depending upon a degree of a lateral extension of the profile N, the minimum plateau may be a minimum. A doping profile P of a species of p-dopants has a maximum Pmax in the part 342.

FIGS. 4A to 4J illustrate schematic cross-sectional views of an n⁻-doped semiconductor body 410 at different phases of processing a superjunction semiconductor device. A mask 412 is formed on a first side 414 of the semiconductor body 410. Patterning of the mask 412, e.g. by lithography, results in mask openings. Trenches 416 are formed from the first side 414 into the semiconductor body 410, e.g. by using an anisotropic etch process such as RIE.

Dimensions of the trenches 416, e.g. a width w and a depth d, may be chosen as described with regard to the embodiment illustrated in FIGS. 2A to 2F.

Plasma doping by PLAD or PIII using a process gas configured for n-doping, e.g. $PF_3$ and/or $PH_3$ is carried out. Plasma doping leads to n-doping of a part 418 of the semiconductor body 410 at sidewalls 420a, 420b as well as at a bottom side 422 of the trenches 416 (FIG. 4B). A penetration depth of the dopants, or, in other words, a thickness of the part 418 after PLAD is comparatively low, e.g. in a range between 0.2 nm and 20 nm, or between 0.5 nm to 10 nm or even between 1 nm to 3 nm. As regards further parameters of plasma doping, reference is drawn to FIG. 1 and the related part of the description. According to an embodiment, a dose of dopants introduced by plasma doping via a unit area of the sidewalls 420a, 420b is at least five times larger than a dose of dopants in a part of the semiconductor body 410 between the trenches 416 which corresponds to $(p-w)/2 \times N$, wherein N is a net doping of the n⁻-doped semiconductor body 410 between the trenches 416. Further, the mask 412 is removed from the first side 414, e.g. by an etch process.

Figure 4A:
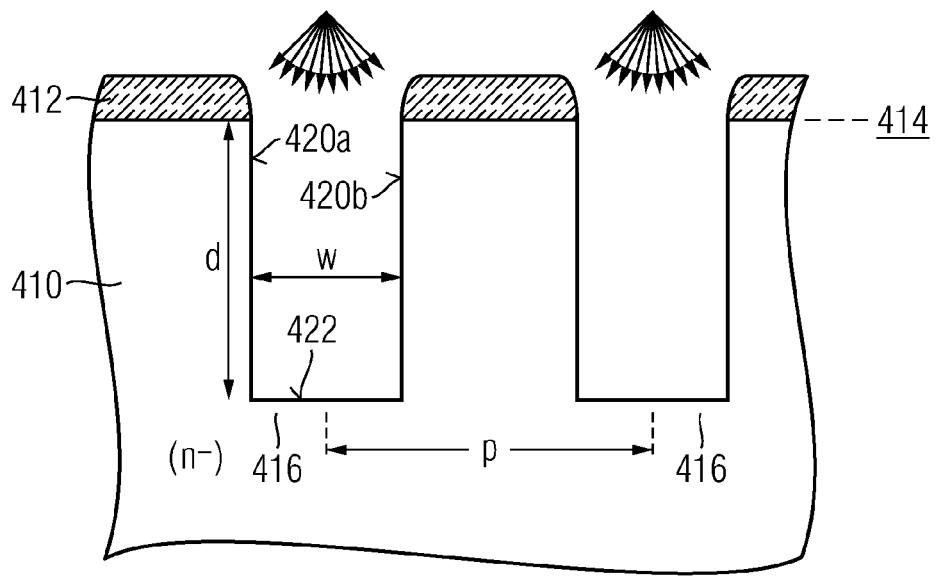
FIGS. 4A to 4J illustrate schematic cross-sectional views of a semiconductor body at different phases during yet another embodiment of a method of manufacturing a superjunction device.
Figure 4B:
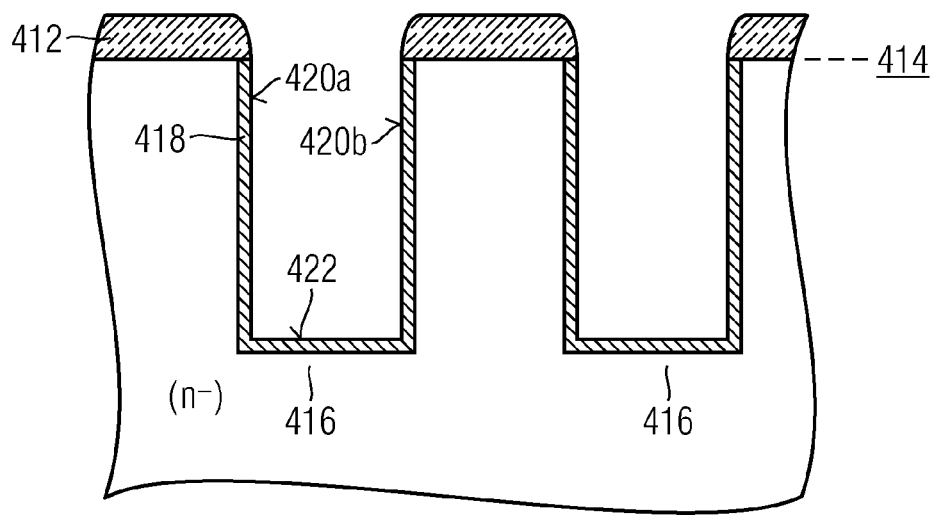
Figure 4C:
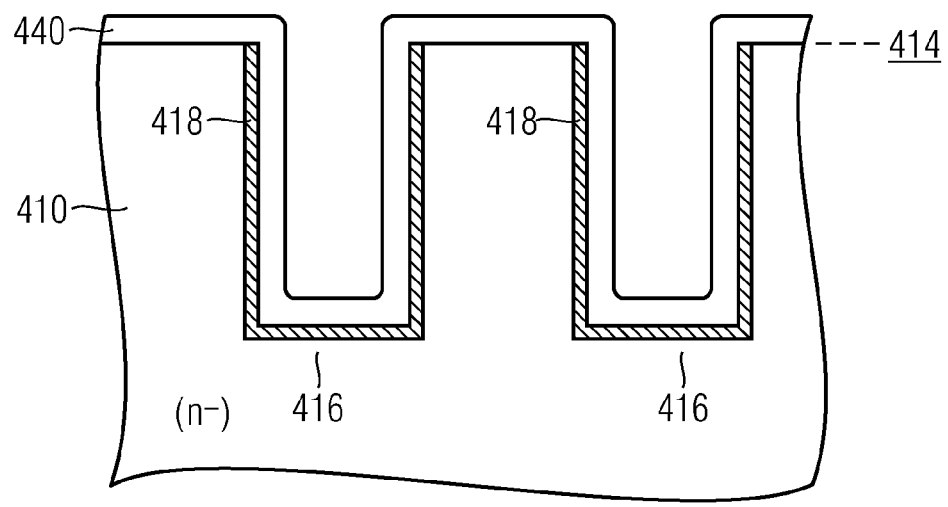

Referring to the schematic cross-sectional view of the semiconductor body 410 illustrated in FIG. 4C, a first semiconductor layer 440, e.g. a conformal undoped or lightly doped silicon layer is formed on the part 418 in the trenches 416 by lateral epitaxy or CVD. As an example, lateral epitaxy or low pressure CVD (LPCVD) may be used to achieve a conformal deposition of the first semiconductor layer 440 lining the sidewalls 420a, 420b and the bottom side 422 of the trenches 416. As an example, a thickness of the first semiconductor layer 440 may range between 2% to 30% or between 5% and 20% of the width w.

Figure 4D:
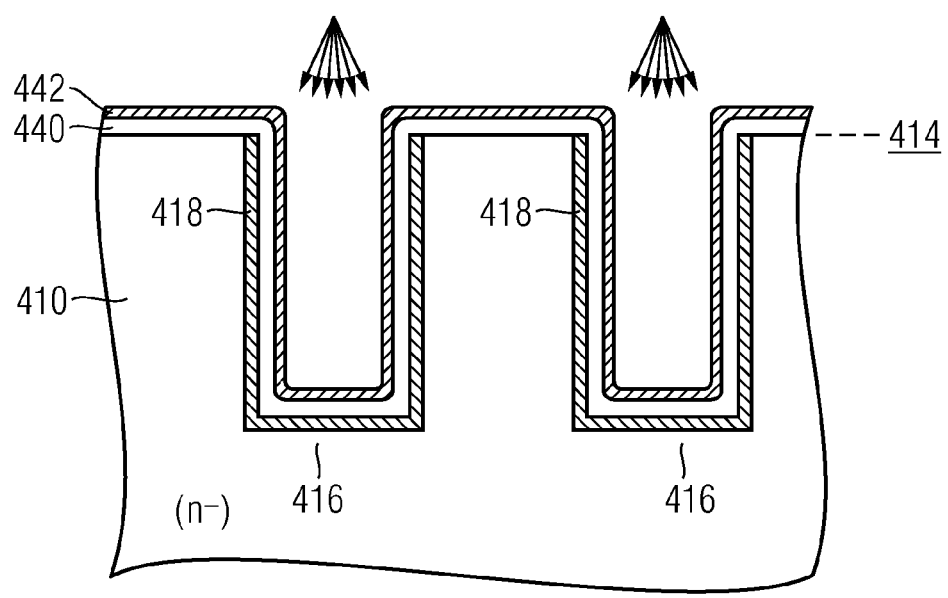

Referring to the schematic cross-sectional view of the semiconductor body 410 illustrated in FIG. 4D, plasma doping by PLAD or PIII using a process gas configured for p-doping, e.g. $BF_3$ and/or $B_2H_6$ is carried out. Plasma doping leads to p-doping of the first semiconductor layer 440. A penetration depth of the dopants, or, in other words, a thickness of a doped part 442 of the first semiconductor layer 440 after PLAD is comparatively low, e.g. in a range between 0.2 nm and 20 nm, or between 0.5 nm and 10 nm or even between 1 nm and 3 nm. As regards further parameters of plasma doping, reference is drawn to FIG. 1 and the related part of the description. Furthermore, masking layers preventing outdiffusion can be formed as described above. According to an embodiment, a dose of p-dopants introduced by plasma doping into a unit area of the part 442 ranges between 170% and 230%, or between 190% and 210%, or between 195% and 205% of the dose of n-dopants previously introduced into the part 418 by plasma doping.

Figure 4E:
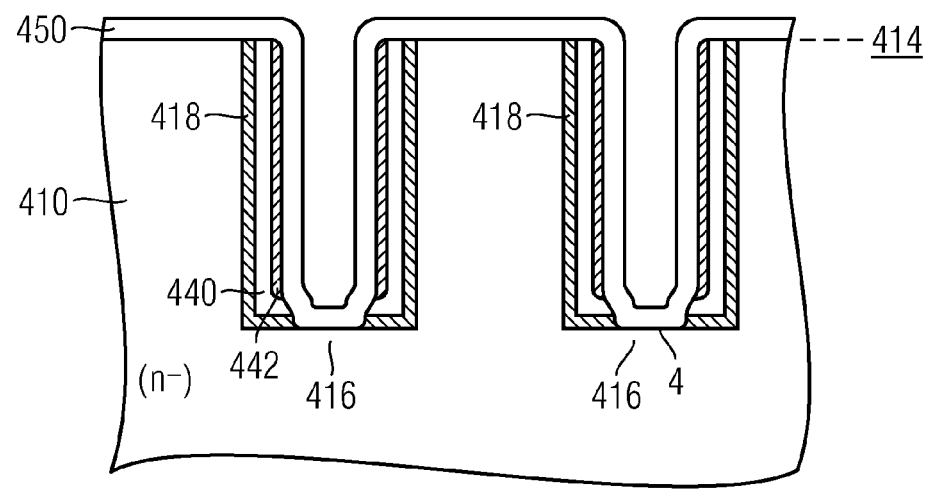

Referring to the schematic cross-sectional view of the semiconductor body 410 illustrated in FIG. 4E, the first semiconductor layer 440 is removed from the first side 414 and from the bottom side 422 of the trenches 416, e.g. by an anisotropic etch process. A second semiconductor layer 450, e.g. a conformal undoped or lightly doped silicon layer is formed on the doped part 442 in the trenches 416, on the bottom side 422 and on the first side 414 by lateral eptitaxy or by CVD. As an example, lateral epitaxy or low pressure CVD (LPCVD) may be used to achieve a conformal deposition of the second semiconductor layer 450 lining the sidewalls 420a, 420b and the bottom side 422 of the trenches 416.

Figure 4F:
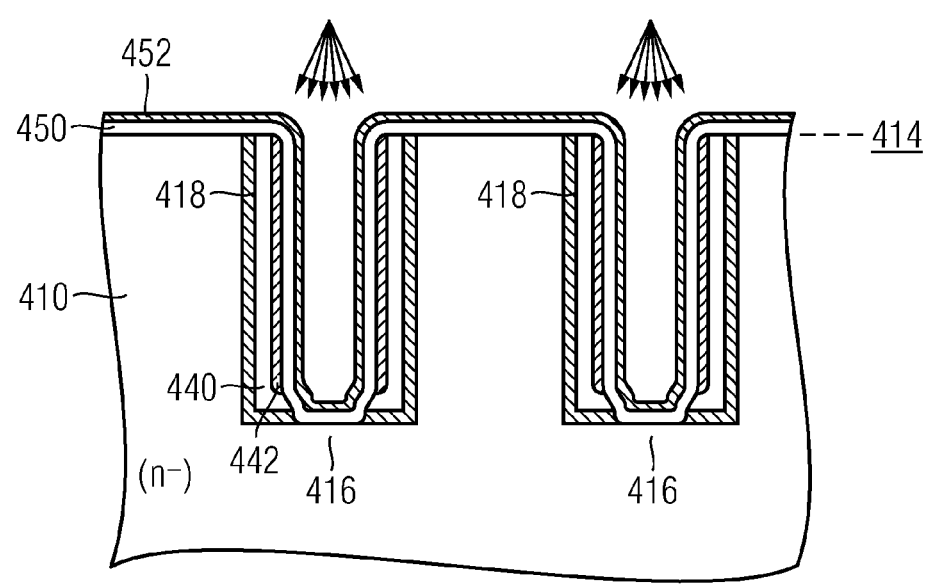

Referring to the schematic cross-sectional view of the semiconductor body 410 illustrated in FIG. 4F, plasma doping by PLAD or PIII using a process gas configured for n-doping, e.g. e.g. $PF_3$ and/or $PH_3$ is carried out. Plasma doping leads to n-doping of the second semiconductor layer 450. A penetration depth of the dopants, or, in other words, a thickness of a doped part 452 of the second semiconductor layer 450 after PLAD is comparatively low, e.g. in a range between 0.2 nm and 20 nm, or between 0.5 nm and 10 nm or even between 1 nm and 3 nm. As regards further parameters of plasma doping, reference is drawn to FIG. 1 and the related part of the description. According to an embodiment, a dose of dopants introduced into the part 452 by plasma doping via a unit area of the sidewalls 420a, 420b corresponds to the dose introduced into the part 418 by plasma doping.

Figure 4G:
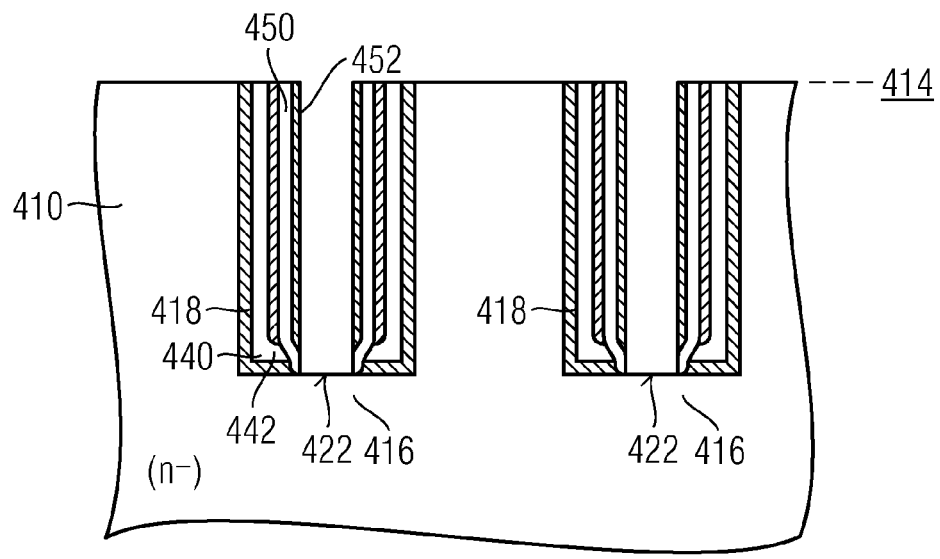

Referring to the schematic cross-sectional view of the semiconductor body 410 illustrated in FIG. 4G, the second semiconductor layer 450 is removed from the first side 414 and from the bottom side 422 of the trenches 416, e.g. by an anisotropic etch process.

Figure 4H:
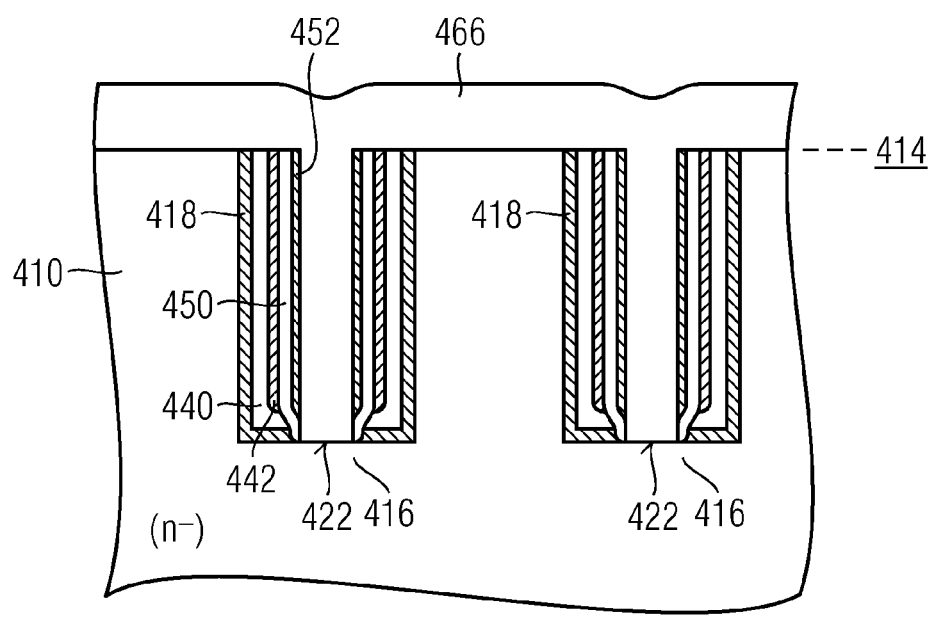

Referring to the schematic cross-sectional view of the semiconductor body 410 illustrated in FIG. 4H, the trenches 416 are filled up with a semiconductor material, e.g. an epitaxial silicon layer formed by lateral epitaxy or CVD. Thus, a filling material 466 fills up the trenches 416. The semiconductor material may be undoped or may include a doping concentration below the doping concentration introduced by the above-described plasma doping into the n-doped part 452.

Figure 4I:
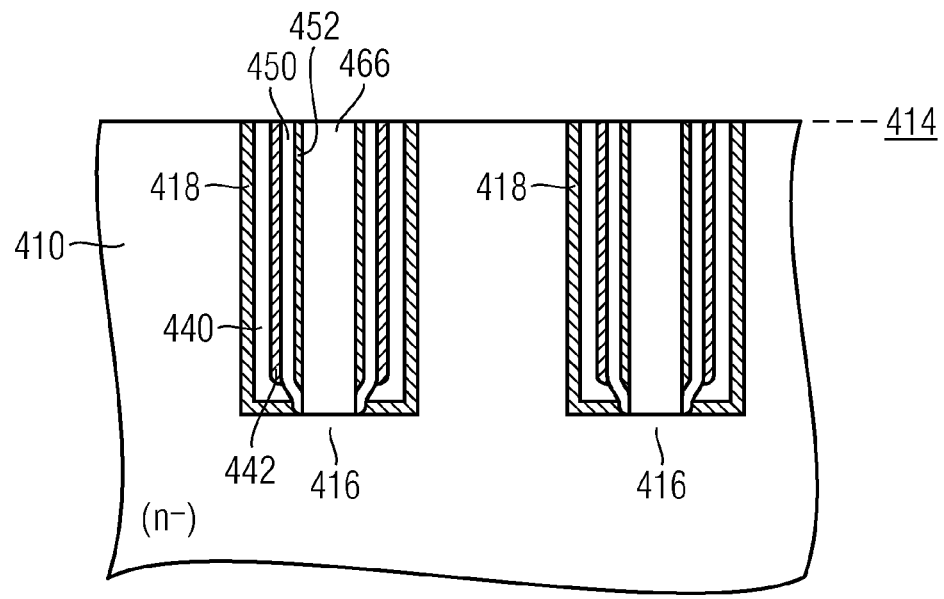

Referring to the schematic cross-sectional view of the semiconductor body 410 illustrated in FIG. 4I, the semiconductor body 410 is planarized at the first side 440, e.g. by chemical mechanical polishing (CMP) and/or by a plasma etch back. Thereby, the filling material 466 is removed from the first side 414.

Figure 4J:
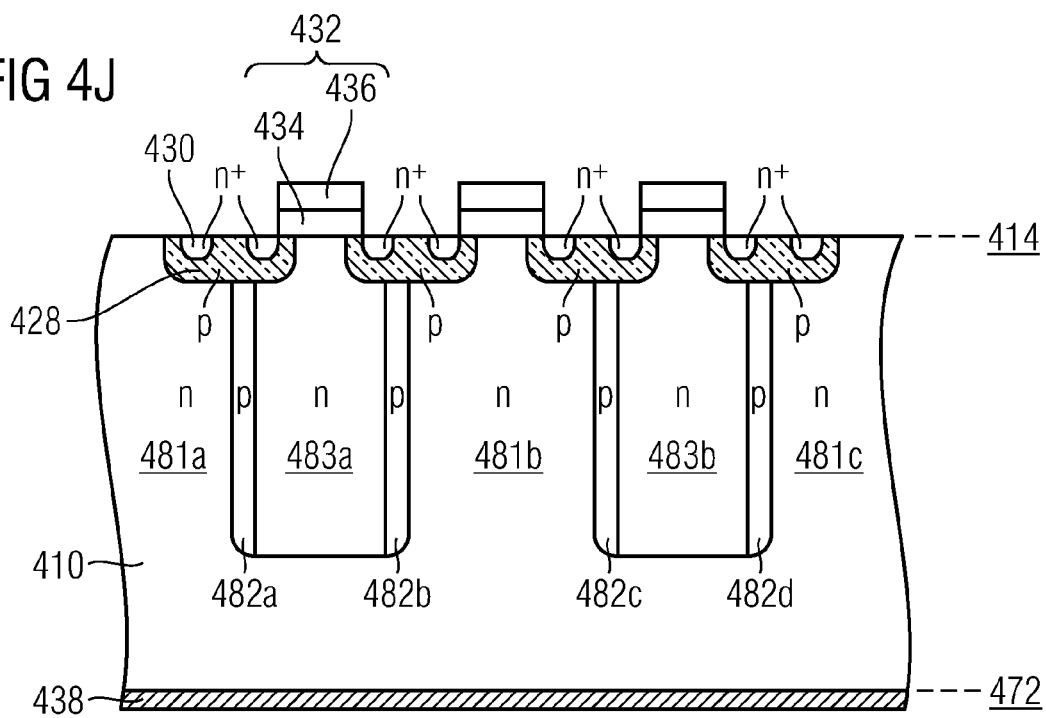

Referring to the schematic cross-sectional view of the semiconductor body 410 illustrated in FIG. 4J, further processes for manufacturing a superjunction semiconductor device are illustrated. A p-doped body region 428 is formed at the first side 414, e.g. by ion implantation of p-type dopants such as boron (B). Further, an $n^+$-doped source zone 430 is formed in the p-doped body region 428 at the first side 414, e.g. by ion implantation of n-type dopants such as phosphor (P). Further, a planar gate structure 432 including a gate dielectric 434 and a gate electrode 436 is formed at the first side 414. A drain contact 438 is formed at a second side 472 opposite the first side 414. Additional known elements such as dielectric layers, e.g. interlayer dielectrics and conductive layers such as metallization layers which may be interconnected or connected to the semiconductor body by contacts may follow to complete the superjunction device.

The n-dose introduced into the part 418 as illustrated in FIGS. 4A, 4B defines an n-doping in drift zone parts 481a, 481b and 481c. The p-dose introduced into the part 442 as illustrated in FIG. 4D defines a p-doping in charge compensation regions 482a, 482b, 482c, 482d. The n-dose introduced into the part 452 as illustrated in FIG. 4F defines an n-doping in drift zone parts 483a, 483b.

The above described embodiments allow to manufacture superjunction devices having a precise charge compensation and compact design with homogeneous trench sidewall doping.

Terms such as "first", "second", and the like, are used to describe various structures, elements, regions, sections, etc. and are not intended to be limiting. Like terms refer to like elements throughout the description.

The terms "having", "containing", "including", "comprising" and the like are open and the terms indicate the presence of stated elements or features, but not preclude additional elements or features. The articles "a", "an" and "the" are intended to include the plural as well as the singular, unless the context clearly indicates otherwise.

It is to be understood that the features of the various embodiments described herein may be combined with each other, unless specifically noted otherwise.

Although specific embodiments have been illustrated and described herein, it will be appreciated by those of ordinary skill in the art that a variety of alternate and/or equivalent implementations may be substituted for the specific embodiments shown and described without departing from the scope of the present invention. This application is intended to cover any adaptations or variations of the specific embodiments discussed herein. Therefore, it is intended that this invention be limited only by the claims and the equivalents thereof.

What is claimed is:

1. A method of manufacturing a semiconductor device, comprising:
    forming a super-junction field effect transistor by:
        forming trenches in a semiconductor body from a first side, wherein a depth of the trenches ranges between 10 μm and 120 μm;
        forming charge compensation layers by doping parts of the semiconductor body via sidewalls of the trenches by introducing dopants by plasma doping; and thereafter
        forming an out-diffusion barrier layer on the sidewalls of the trenches; and thereafter widening a profile of the dopants introduced by plasma doping by diffusion caused by a thermal heating process, wherein the super-junction field effect transistor has a breakdown voltage of at least 100 V; and forming a drain contact at a second side opposite to the first side, and wherein doping the parts of the semiconductor body by plasma doping comprises introducing dopants into the parts of the semiconductor body via the sidewalls of the trenches at a dose in a range of $5\times10^{11}$ cm$^{-2}$ to $5\times10^{12}$ cm$^{-2}$;

doping the parts of the semiconductor body by plasma doping comprises adjusting a DC-voltage pulse rise time smaller than 0.1 µs; and wherein a surface concentration of dopants introduced by plasma doping via a unit area of the sidewalls is at least ten times larger than a concentration of dopants in a mesa region of the semiconductor body between neighboring trenches which corresponds to N, wherein N is a net doping of the semiconductor body between the neighboring trenches.

2. The method of claim 1, wherein the semiconductor body is a silicon semiconductor body.

3. The method of claim 1, wherein the semiconductor body is a silicon carbide semiconductor body.

4. The method of claim 1, wherein doping the parts of the semiconductor body by plasma doping comprises adjusting a DC-voltage pulse distance in a range of 100 µs to 10 ms.

5. The method of claim 1, wherein doping the parts of the semiconductor body by plasma doping comprises adjusting a DC-voltage pulse width in a range of 0.5 µs to 20 µs.

6. The method of claim 1, further comprising filling the trenches with a semiconductor material.

7. The method of claim 1, further comprising filling the trenches with an insulating material.

8. The method of claim 1, further comprising forming a first semiconductor layer on the doped parts of the semiconductor body.

9. The method of claim 8, wherein the forming the first semiconductor layer on the doped parts of the semiconductor body comprises forming a silicon layer by lateral epitaxy or low-temperature chemical vapor deposition.

10. The method of claim 8, wherein forming the first semiconductor layer on the doped parts of the semiconductor body comprises:
forming an amorphous silicon layer on the doped parts of the semiconductor body; and
crystallizing the amorphous silicon layer by a heat treatment.

11. The method of claim 1, further comprising forming an insulating outdiffusion barrier layer on the parts of the semiconductor body.

12. The method of claim 1, wherein a transistor device is formed as the semiconductor device including the doped parts of the semiconductor body as an edge termination structure.

13. The method of claim 1, wherein the semiconductor body includes a drift zone of a first conductivity type, and wherein doping the parts of the semiconductor body by plasma doping comprises doping the parts of the semiconductor body with dopants of a second conductivity type complementary to the first conductivity type.

14. The method of claim 1, wherein the semiconductor body includes a drift zone of a first conductivity type, and wherein doping the parts of the semiconductor body by plasma doping comprises doping the parts of the semiconductor body with dopants of the first conductivity type, the method further comprising:
forming a first semiconductor layer over the parts of the semiconductor body in the trenches; and
doping the first semiconductor layer by plasma doping with dopants of a second conductivity type complementary to the first conductivity type.

15. The method of claim 14, further comprising:
removing the first semiconductor layer from a bottom side of the trenches;
forming a second semiconductor layer over the first semiconductor layer in the trenches; and
doping the second semiconductor layer by plasma doping with dopants of the first conductivity type.

16. The method of claim 1, further comprising forming body regions in the semiconductor body at the first side, the body regions overlapping the charge compensation layers.

* * * * *